(12) United States Patent
Tai

(10) Patent No.: US 7,570,102 B2
(45) Date of Patent: Aug. 4, 2009

(54) GATE DRIVING CIRCUIT FOR DRIVING A GATE ELECTRODE OF AN ELECTRIC POWER SWITCHING ELEMENT WITH SIMPLE STRUCTURE

(75) Inventor: Hiromichi Tai, Saitama-ken (JP)

(73) Assignee: Toshiba Mitsubishi - Electric Industrial Systems Corporation, Tokyo (JP)

( * ) Notice: Subject to any disclaimer, the term of this patent is extended or adjusted under 35 U.S.C. 154(b) by 0 days.

(21) Appl. No.: 10/571,001

(22) PCT Filed: Sep. 10, 2004

(86) PCT No.: PCT/JP2004/013223

§ 371 (c)(1),
(2), (4) Date: Dec. 22, 2006

(87) PCT Pub. No.: WO2005/027328

PCT Pub. Date: Mar. 24, 2005

(65) Prior Publication Data

US 2007/0080738 A1    Apr. 12, 2007

(30) Foreign Application Priority Data

Sep. 10, 2003   (JP)   ............................... 2003-318588

(51) Int. Cl.
*H03K 17/687* (2006.01)
(52) U.S. Cl. .................. 327/434; 327/108; 327/435; 327/436

(58) Field of Classification Search ............ 327/108, 327/436
See application file for complete search history.

(56) References Cited

U.S. PATENT DOCUMENTS

| 5,621,601 A | 4/1997 | Fujihira et al. | |
| 5,920,472 A * | 7/1999 | Bijlenga et al. | ............... 363/97 |
| 2003/0042939 A1* | 3/2003 | Kato et al. | ................... 327/108 |

FOREIGN PATENT DOCUMENTS

| EP | 0 647 026 A2 | | 4/1995 |
| JP | 2000-224837 A | | 8/2000 |
| JP | 2001-238431 | * | 8/2001 |
| JP | 2001-238431 A | | 8/2001 |
| JP | 2002-171746 A | | 6/2002 |

* cited by examiner

*Primary Examiner*—Kenneth B Wells
*Assistant Examiner*—John W Poos
(74) *Attorney, Agent, or Firm*—Foley & Lardner LLP

(57) ABSTRACT

A one mode of a gate driving circuit that drives a gate electrode of an electric power switching element (9), comprising drive means (6) configured to supply to the gate electrode a current in accordance with a voltage applied across the principal electrodes of the electric power switching element (9), while utilizing a voltage produced by dividing a voltage applied across the principal electrodes by use of resistors (4a, 4b). Since the drive means (6) utilizes a voltage produced by a voltage dividing resistor circuit, which divides the voltage applied across the principal electrodes of the electric power switching element (9) as a power source voltage, only an addition of the dividing resistors (4a, 4b) makes it possible to constitute the power source for the current drive means (6).

1 Claim, 5 Drawing Sheets

US 7,570,102 B2

GATE DRIVING CIRCUIT FOR DRIVING A GATE ELECTRODE OF AN ELECTRIC POWER SWITCHING ELEMENT WITH SIMPLE STRUCTURE

TECHNICAL FIELD

The present invention relates to a gate driving circuit configured to drive an electric power switching element.

BACKGROUND ART

A power converter employing an electric power switching element has steadily broadened a range of applications owing to increased capacity and speed of the switching element. Among electric power switching elements, especially, an insulating gate bipolar transistor (IGBT) and a metal-oxide semiconductor field effect transistor (MOSFET), both of which are an MOS gate type switching element, have stretched out to a various field of applications.

The IGBT and MOSFET are a non-latching type switching element in which an on/off state is not self-sustained, so that they have a great advantage over a latching type switching element such as a thyristor or the like in that higher controllability due to a gate drive is ensured. Such a non-latching type switching element is unrestrainedly able to prevent an occurrence of a surge voltage or current and regulate a current or voltage gradient during a switching transient period owing to gate-control thereof.

By the way, as a gate driving circuit configured to protect an electric power switching element from a surge current by gate-control, there has been known one comprised of an electric power switching element including a sensing terminal that shunts part of a main current from a gate terminal to be used to input a control signal as a current-detection current, a computing means that deducts a certain amount of current from the current-detection current shunted by the sensing terminal, an accumulating means that accumulates the remaining current after the certain amount of current is deducted by the computing means when a value of the remaining current is positive, and a controlling means that controls a gate voltage of the electric power switching element based on the output from the accumulating means (See Japanese Patent Application Laid-open Publication No. 2000-224837, for example). According to this gate driving circuit, the main current flowing through the electric power switching element is stably controlled without relying on feedback control.

The above gate driving circuit protects from a surge current the electric power switching element having the sensing terminal as well as a gate terminal by controlling the gate terminal without relying on feedback control. However, an electric power switching element having not the sensing terminal but only a gate terminal is generally protected from a surge voltage or the like by employing feedback control to control the gate terminal.

As an example of a conventional gate driving circuit that controls a gate terminal to protect an electric power switching element from a surge voltage or the like by employing feedback control, there has been known one shown in FIG. 1, for example. By supplying a gate signal output to a gate electrode (control input terminal) of an electric power switching element 9 from a voltage amplifier 2 via a gate resistor 3, a gate drive of the electric power switching element 9 is carried out under a normal operation condition. At the same time, by supplying a current to the gate electrode of the electric power switching element 9 from a control current-source 6 as a current drive means, an active gate drive of the electric power switching element 9 is carried out. In this case, the control current-source 6 is controlled by a voltage amplifier 5 in the following way. That is, the voltage amplifier 5 inputs a divided voltage detection signal obtained by dividing a principal voltage Vce applied across principal electrodes (collector-emitter) of the electric power switching element 9 by use of voltage-dividing resistors 4a, 4b and thus controls the control current-source 6. A reference mark 10 designates a flywheel diodes connected parallel with the electric power switching element 9.

In the above gate driving circuit, a surge voltage generated when the electric power switching element 9 turns off is suppressed in the following manner. An external signal coming thereinto affects the voltage amplifier 2 so as to reduce the output voltage thereof, which then reduces the gate voltage applied thereto via the gate resistor 3. When the gate voltage of the electric power switching element 9 becomes lower than a threshold voltage of a certain value determined in accordance with a static characteristic of the switching element, the current flowing through the electric power switching element 9 starts to reduce and at the same time the principal voltage Vce of the electric power switching element 9 starts to increase abruptly.

The principal voltage Vce is divided by the resistors 4a, 4b and phase compensation capacitors 13a, 13b. The divided voltage as a principal voltage detection signal is input into the voltage amplifier 5 and amplified to an appropriate level therein, thereby controlling the control current-source 6. Therefore, when the principal voltage Vce exceeds a predetermined value, the current injected from the control current-source 6 makes the gate voltage of the electric power switching element 9 increase. Then, the electric power switching element 9 returns back to an on state, thereby preventing a further increase in the principal voltage Vce. Such operation by the gate driving circuit above prevents the principal voltage applied to the electric power switching element 9 from exceeding a certain value determined by the main circuit, thereby suppressing an occurrence of a surge voltage.

The gate driving circuit employing an electric power switching element having the sense terminal as well as the gate terminal protects the electric power switching element from a surge current by controlling the gate terminal of the electric power switching element without feedback control. However, an electric power switching element having not a sensing terminal but only a gate terminal is generally protected from a surge current or the like by controlling the gate terminal through feedback control.

In such a gate driving circuit by controlling the gate terminal through feedback control to protect the electric power switching element from a surge voltage or the like, one end of the control current-source 6 is connected to a positive terminal of a gate drive power source 1c as illustrated in FIG. 1. Such connection is based on the following reason.

The gate-emitter voltage Vge of the electric power switching element 9 is determined by gate drive power sources 1a, 1b. The voltage value is about +/−15 volts in a majority of switching elements. The control current-source 6 is required to feed a certain amount of current determined through a control of the voltage amplifier 5 into the gate electrode of the electric power switching element 9, regardless of the gate-emitter voltage Vge.

Unless this current is kept constant, the output current from the control current-source 6 is fluctuated by fluctuation of the gate-emitter voltage Vge, which may become an error factor in feedback-controlling the principal voltage Vce. Therefore, the power source voltage of the control current-source 6 has to be as high as possible compared to the gate-emitter voltage Vge. In fact, there is required a power source that can afford a voltage of from several to less than 20 volts as the gate drive power source 1c, taking account of a loss in the circuit. As explained, the conventional art as illustrated in FIG. 1 requires a power source that affords a higher voltage, let alone the gate drive power source per se, for a gate control during a transient period.

In addition, in the gate driving circuit illustrated in FIG. 1, the principal voltage Vce is divided by the voltage-dividing resistors 4a, 4b and the phase compensation capacitors 13a, 13b in order to obtain a principal voltage detection signal in proportion to the principal voltage Vce and the divided voltage as an input signal is amplified by the voltage amplifier 5. In such configuration, the voltage amplifier 5 has to have a higher input impedance in order to reduce an electric power loss. That is, if the input impedance is lower, a resistance of the voltage-dividing resistors 4a, 4b needs to be lower; and thus the resistors 4a, 4b having a lower resistance cause a larger power loss therein in case of a voltage converter in which the principal voltage Vce to be applied to the electric power switching element 9 reaches to several thousands volts.

The present invention has been made in view of the above and the objective thereof is to realize a power source for use in an active gate drive means having a simple configuration at a low cost. Another objective of the present invention is to provide a gate driving circuit that enables a lower cost operation of a control signal detection means configured to carry out an active gate control.

DISCLOSURE OF INVENTION

A gate driving circuit according to a first aspect of the present invention is characterized in that the gate driving circuit comprises drive means configured to receive as a power source voltage a predetermined voltage based on a principal voltage to be applied across principal electrodes of the switching element and thereby to drive the gate electrode in accordance with the principal voltage.

According to the above gate driving circuit, the electric power switching element is effectively protected from a surge voltage or the like since the gate electrode of the electric power switching element is subject to an active gate drive. In addition, since the drive means provided in this gate driving circuit utilizes a predetermined voltage based on the voltage (principal voltage) applied across the principal electrodes of the electric power switching element as a power source voltage, the power source for the active gate drive means is simplified, thereby reducing a production cost.

A gate driving circuit according to a second aspect of the present invention is characterized in that the predetermined voltage is a voltage produced by a voltage dividing resistor circuit, which divides the principal voltage, and that the drive means is a current driver that supplies a current to the gate electrode in accordance with the principal voltage, in the above gate driving circuit.

This current drive means utilizes a voltage produced by resistor-dividing the voltage applied across the principal electrodes of the electric power switching element as a power source voltage. Namely, the power source voltage for the electric drive means is prepared only by adding the voltage-dividing resistors.

A gate driving circuit according a third aspect of the present invention is characterized in that the predetermined voltage is a voltage across a capacitor charged via a diode with a voltage produced by resistor-dividing the principal voltage, and that the drive means is a current driver that supplies a current to the gate electrode in accordance with the principal voltage.

This configuration provides the following advantage in addition to advantages of simple construction and low production cost. While a pulse-like voltage is generally applied across the principal electrodes of the electric power switching element, the voltage produced by a voltage dividing resistor circuit, which divides the principal voltage applied across the principal electrodes is smoothed by the diode and the capacitor. The current drive means operates on the smoothed voltage as its power source voltage, thereby ensuring a more ensured active gate drive.

A gate driving circuit according to a fourth aspect of the present invention is characterized in that the predetermined voltage is a voltage across a capacitor charged via a diode with a voltage produced by resistor-dividing the principal voltage, one terminal of the capacitor being connected to a positive terminal of a power source for the gate driving circuit per se, and that the drive means is a current driver that supplies a current to the gate electrode in accordance with the principal voltage, in the gate driving circuit according to the first aspect.

A power source voltage required to operate the current drive means is higher by a predetermined voltage than a voltage of the gate drive voltage source at a normal operation state in the electric power switching element. By connecting one terminal of the electric charge capacitor to a positive terminal of the power source for the gate driving circuit per se, a voltage higher by a voltage across the terminals of the charged capacitor than the power source voltage of the gate driving circuit per se is supplied to the electric driving source as a power source voltage.

A gate driving circuit according to a fifth aspect of the present invention is characterized in that the predetermined voltage is a voltage across a constant voltage diode connected in series with a resistor between the principal electrodes, and that the drive means is a current driver that supplies a current to the gate electrode in accordance with the principal voltage, in the gate driving circuit according to the first aspect.

According to this configuration, a power source voltage is provided to the current drive means while retaining a simple circuit layout by using a constant voltage diode. In addition, since the voltage across the constant voltage diode is utilized as a power source voltage, the current drive means is able to operate on a stable power source voltage, thereby providing an ensured active gate drive.

A gate driving circuit according to a sixth aspect of the present invention is characterized in that the predetermined voltage is a voltage across a constant voltage diode connected in series with a resistor between the principal electrodes, one terminal of the constant voltage diode being connected to a positive terminal of a power source for the gate driving circuit per se, and that the drive means is a current driver that supplies a current to the gate electrode in accordance with the principal voltage, in the gate driving circuit according to the first aspect. The voltage higher than the power source voltage for the gate driving circuit per se by a voltage across the terminals of the constant voltage diode is supplied to the current driver as its power source voltage.

A gate driving circuit according to a seventh aspect of the present invention is characterized in that the predetermined voltage is a voltage across a constant voltage diode connected in series with a resistor between the principal electrodes, the constant voltage diode being connected parallel with a capacitor, and that the drive means is a current driver that supplies a current to the gate electrode in accordance with the principal voltage, in the gate driving circuit according to the first aspect. The gate driving circuit of the seventh aspect demonstrates an effect of a stabilized gate drive by the current driver due to a smoothed voltage across the constant voltage diode, in addition to the effect demonstrated by the fifth aspect of the present invention.

A gate driving circuit according to an eighth aspect of the present invention is characterized in that the predetermined voltage is a voltage produced by resistor-dividing the principal voltage, and that the drive means is a voltage driver that applies a voltage in accordance with the principal voltage to the gate electrode when the principal voltage exceeds a predefined voltage value, in the gate driving circuit according to the first aspect. This voltage driver utilizes as a power source voltage a voltage produced by resistor-dividing the voltage applied across the principal electrodes of the electric power switching element. Therefore, the gate driving circuit having a simple configuration can be realized. In addition, the voltage driver operates when the voltage applied across the principal electrodes exceeds a predefined voltage value because of a surge voltage for example, the electric power switching element is surely protected from the surge voltage or the like.

A gate driving circuit according to a ninth aspect of the present invention is characterized in that the predetermined voltage is a voltage across a capacitor charged via a diode with a voltage produced by resistor-dividing the principal voltage, and that the drive means is a voltage driver that applies a voltage in accordance with the principal voltage to the gate electrode when the principal voltage exceeds a predefined voltage value, in the gate driving circuit according to the first aspect. Due to this configuration, a smoothed voltage is applied to the voltage driver as a power source voltage, thereby ensuring an active gate drive. Additionally, the voltage driver operates when the voltage applied across the principal electrodes exceeds a predefined voltage value, thereby surely protecting the electric power switching element from the surge voltage or the like.

A gate driving circuit according to a tenth aspect of the present invention is characterized in that the predetermined voltage is a voltage across a capacitor charged via a diode with a voltage produced by resistor-dividing the principal voltage, one terminal of the capacitor being connected to a positive terminal of a power source for the gate driving circuit per se, and that the drive means is a voltage driver that applies a voltage in accordance with the principal voltage to the gate electrode when the principal voltage exceeds a predefined voltage value, in the gate driving circuit according to the first aspect. By connecting one terminal of the capacitor to the positive terminal of the power source for the gate driving circuit per se, a voltage higher than the power source voltage for the gate driving circuit per se by the voltage across the capacitor is supplied to the voltage driver as its power source voltage.

A gate driving circuit according to an eleventh aspect of the present invention is characterized in that the predetermined voltage is a voltage across a constant voltage diode connected in series with a resistor between the principal electrodes, and that the drive means is a voltage driver that applies a voltage in accordance with the principal voltage to the gate electrode when the principal voltage exceeds a predefined voltage value, in the gate driving circuit according to the first aspect. The voltage driver utilizes the voltage across the terminals of the constant voltage diode as its power source voltage, thereby ensuring a simple circuit layout. In addition, the voltage driver operates when the voltage across the principal electrodes exceeds a predefined voltage value because of a surge voltage or the like, thereby surely protecting the switching element.

A gate driving circuit according to a twelfth aspect of the present invention is characterized in that the predetermined voltage is a voltage across a constant voltage diode connected in series with a resistor between the principal electrodes, one terminal of the constant voltage diode being connected to a positive terminal of a power source for the gate driving circuit per se, and that the drive means is a voltage driver that applies a voltage in accordance with the principal voltage to the gate electrode when the principal voltage exceeds a predefined voltage value, in the gate driving circuit according to the first aspect. A voltage higher than the power source voltage for the gate driving circuit per se by a voltage across the terminals of the constant voltage diode is supplied to the voltage driver as its power source voltage.

A gate driving circuit according to a thirteenth aspect of the present invention is characterized in that the predetermined voltage is a voltage across a constant voltage diode connected in series with a resistor between the principal electrodes, the constant voltage diode being connected parallel with a capacitor, and that the drive means is a voltage driver that applies a voltage in accordance with the principal voltage to the gate electrode when the principal voltage exceeds a predefined voltage value, in the gate driving circuit according to the first aspect. The gate driving circuit according to the thirteenth aspect demonstrates an effect of a stabilized gate drive by the current driver due to a smoothed voltage across the constant voltage diode, in addition to the effect demonstrated by the gate driving circuit according to the eleventh aspect.

A gate driving circuit according to a fourteenth aspect of the present invention is characterized in that the gate driving circuit further comprises between principal electrodes of the electric power switching element at least one resistor and current detection means configured to detect a current flowing through the resistor, the resistor and the current detection means being connected in series with each other, wherein a signal detected by the current detection means is used as a control signal intended to produce a current or a voltage to drive the gate electrode in accordance with the principal voltage, in the gate driving circuit according to the first aspect. A current flowing in the circuit constituted by connecting the resistor and the current detection means in series is proportional to the voltage applied across the principal electrodes of the electric power switching element. Therefore, the control signal, that is, the principal voltage detection signal proportional to the voltage applied across the principal electrodes of the electric power switching element can be detected as a detection signal of the current driver.

A gate driving circuit according to a fifteenth aspect of the present invention is characterized in that the gate driving circuit further comprises between principal electrodes of the electric power switching element at least one resistor, a capacitor for phase compensation connected parallel with the resistor, and current detection means configured to detect a current flowing through the resistor, the resistor and the current detection means being connected in series with each other, wherein a signal detected by the current detection means is used as a control signal intended to produce a current or a voltage to drive the gate electrode in accordance with the principal voltage, in the gate driving circuit according to the first aspect. A frequency characteristic of the control signal detection circuit in which the resistor and the current driver are connected in series is prevented from deteriorating, thereby detecting the control signal with accuracy.

A gate driving circuit according to a sixteenth aspect of the present invention is characterized in that the gate driving circuit further comprises between principal electrodes of the electric power switching element a bipolar-transistor and at least one resistor connected in series in the principal electrode circuit of the bipolar-transistor, wherein a signal obtained by detecting a current flowing in the principal electrode circuit is used as a control signal intended to produce a current or a voltage to drive the gate electrode in accordance with the principal voltage, in the gate driving circuit according to the first aspect.

A current flowing in the principal voltage circuit, for example, in the collector circuit, through the emitter and the base of the bipolar transistor is proportional to the voltage applied across the principal electrodes of the electric power switching element. Therefore, the control signal can be detected as a voltage signal by detecting via the resistor the current flowing through the principal electrode circuit of the bipolar transistor, or as a current amplified signal by amplifying the current with the current amplifier. When the control signal is detected as a current amplified signal, the current flowing through the principal electrode circuit of the bipolar transistor can be arbitrary set, irrespective of the input impedance of the current amplifier. Therefore, the control signal detection circuit with low power consumption can be realized by adjusting the resistance value of the resistor connected in series in the principal electrode circuit of the bipolar transistor.

A gate driving circuit according to a seventeenth aspect of the present invention is characterized in that the gate driving circuit further comprises between principal electrodes of the electric power switching element an input transistor circuit, an output transistor circuit constituting a current mirror circuit along with the input transistor circuit, and at least one resistor connected in series in the input transistor circuit, wherein a signal obtained by detecting a current flowing in the output transistor circuit is used as a control signal intended to produce a current or a voltage to drive the gate electrode in accordance with the principal voltage, in the gate driving circuit according to the first aspect.

A current flowing through the input transistor circuit of the current mirror circuit is proportional to the voltage applied across the principal electrodes of the electric power switching element. Therefore, the control signal can be detected as a voltage signal by detecting via the resistor the current flowing through the output transistor circuit, or as a current amplified signal by amplifying the current with the current amplifier, in the same way explained above. Thus, the detection signal detection circuit with a lower energy consumption can be realized.

Moreover, according to the fourteenth through the seventeenth aspect of the present invention, since the control signal for carrying out an active gate drive is a signal detected by the current detection means connected in series with the resistor between the principal electrodes of the electric power switching element, the current flowing in the circuit in which the resistor and the current detection means are connected in series can be arbitrary set by adjusting the resistance value, when the current flowing through the current detection means is detected as the current amplified signal by utilizing the current amplifier, in addition to the common effect above. Therefore, the control signal detection means for carrying out an active gate drive is able to operate at low energy consumption.

BEST MODE FOR CARRYING OUT THE INVENTION

Figure 1:
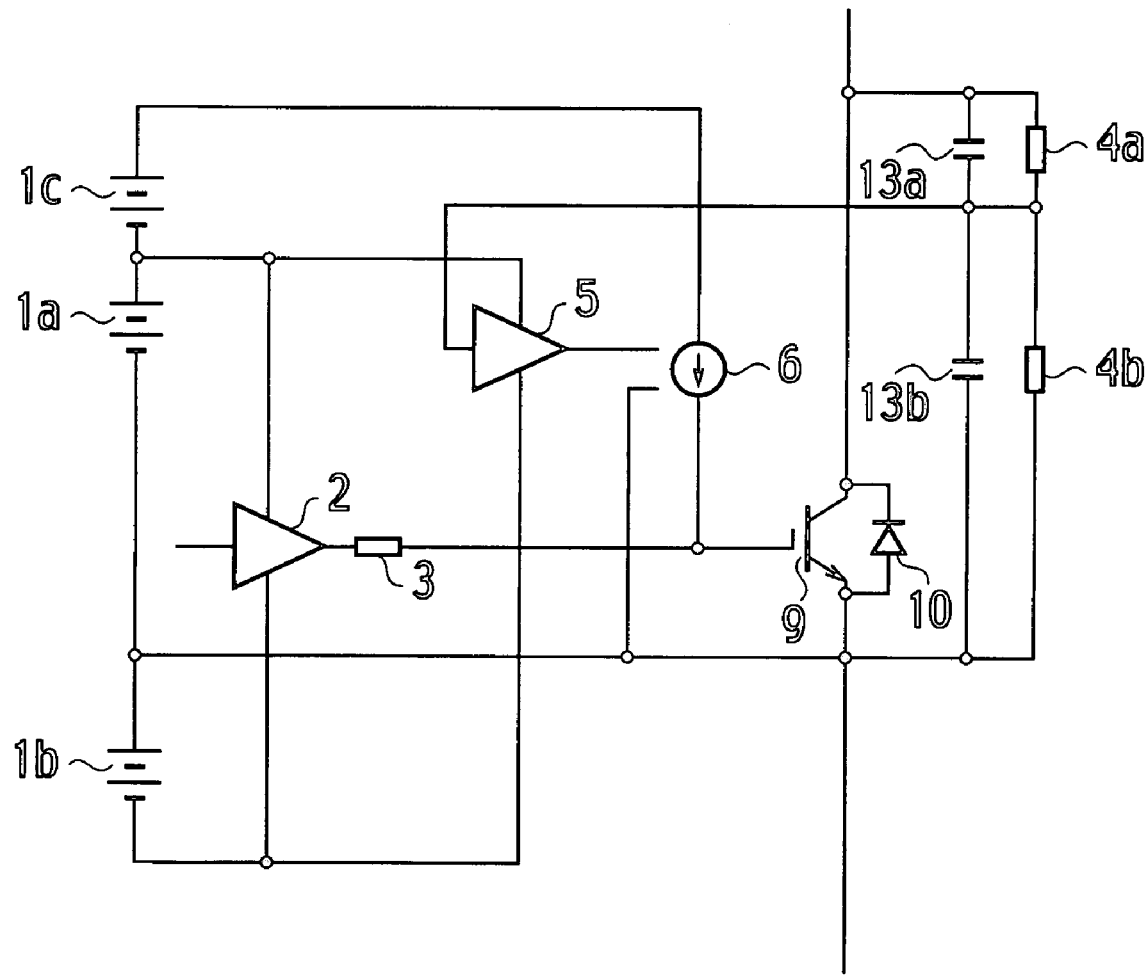
FIG. 1 is a circuit diagram of a conventional gate driving circuit.

Referring to the accompanying drawings, preferred embodiments according to the present invention will be described. In FIGS. 2 to 9, the same or equivalent element or component is designated by the same reference mark as illustrated in FIG. 1 and undue repetition of explanation will be omitted.

A FIRST EMBODIMENT

Figure 2:
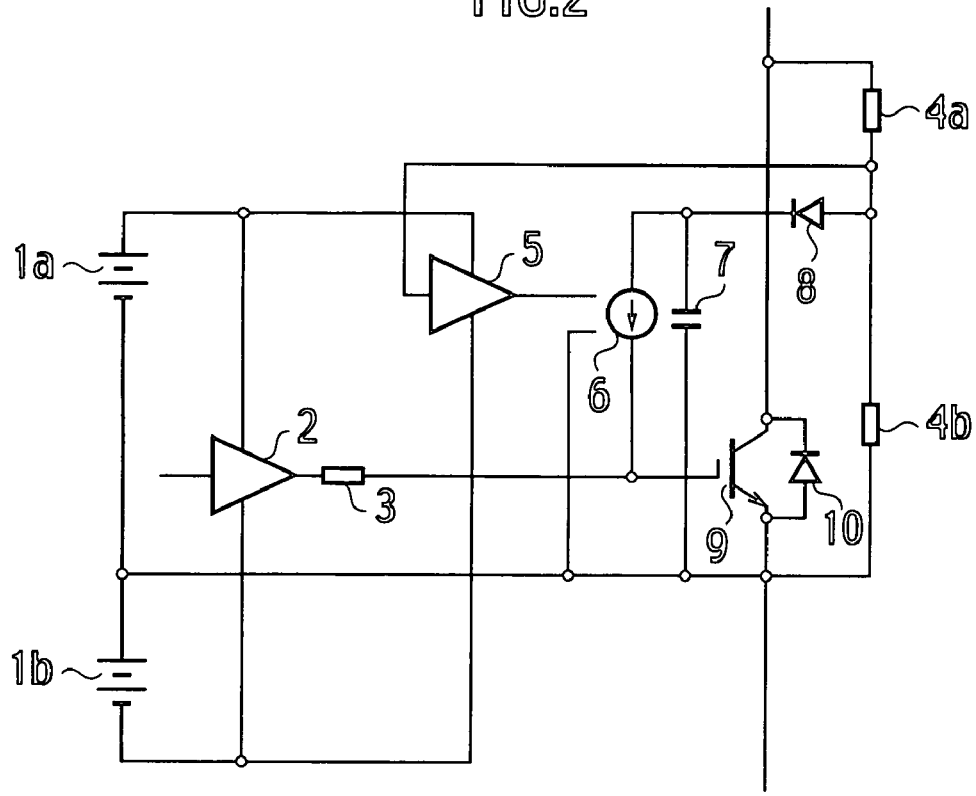
FIG. 2 is a circuit diagram of a gate driving circuit according to a first embodiment of the present invention.

FIG. 2 illustrates a first embodiment of the present invention. In a gate driving circuit according to this embodiment, a power source for a control current source 6 as a current drive source is configured as follows, instead of the gate drive power source 1c in FIG. 1. That is, a capacitor 7 is charged via a diode 8 by a voltage produced by resistor dividing a principal voltage Vce applied across the principal electrodes (collector-emitter) of an electric power switching element 9 by use of resistors 4a, 4b and thus the charged voltage is used as a power source voltage for the control current source 6.

Next, an operation of this embodiment configured above will be described. A value of the voltage divided by the resistors 4a, 4b can be arbitrary set depending on a voltage dividing ratio of the resistors 4a, 4b. Therefore, a power source voltage for the control current source 6 can be handily set at a predetermined value exceeding a voltage of a gate drive power source 1a.

Generally, a pulse-like voltage is applied across the principal electrodes of the electric power switching element 9. Since the capacitor 7 is charged via the diode 8 by the voltage produced by dividing the principal voltage Vce of the electric power switching element 9, the voltage appearing across the capacitor 7 has been smoothed. The current drive means is able to realize an ensured active gate drive since the smoothed charged voltage is used a power source voltage.

By the way, as a power source for the control current source 6, a voltage produced by dividing a principal voltage, Vce of the electric power switching element 9 by use of the resistors 4a, 4b can be directly used. However, since the principal voltage Vce of the electric power switching element 9 usually contains a pulse voltage, it is preferable in terms of ensuring an active gate drive to use the charged voltage smoothed by using the diode 8 and the capacitor 7 as the power source for the control current source 6.

As stated above, in this embodiment, the power source for the control current source 6 as an active gate drive means is composed on the basis of the voltage applied across the principal electrodes of the electric power switching element 9.

Therefore, a power source except for the gate drive power source is no longer necessary, thereby simplifying the power source for the control current source 6 and thus reducing a production cost.

A SECOND EMBODIMENT

Figure 3:
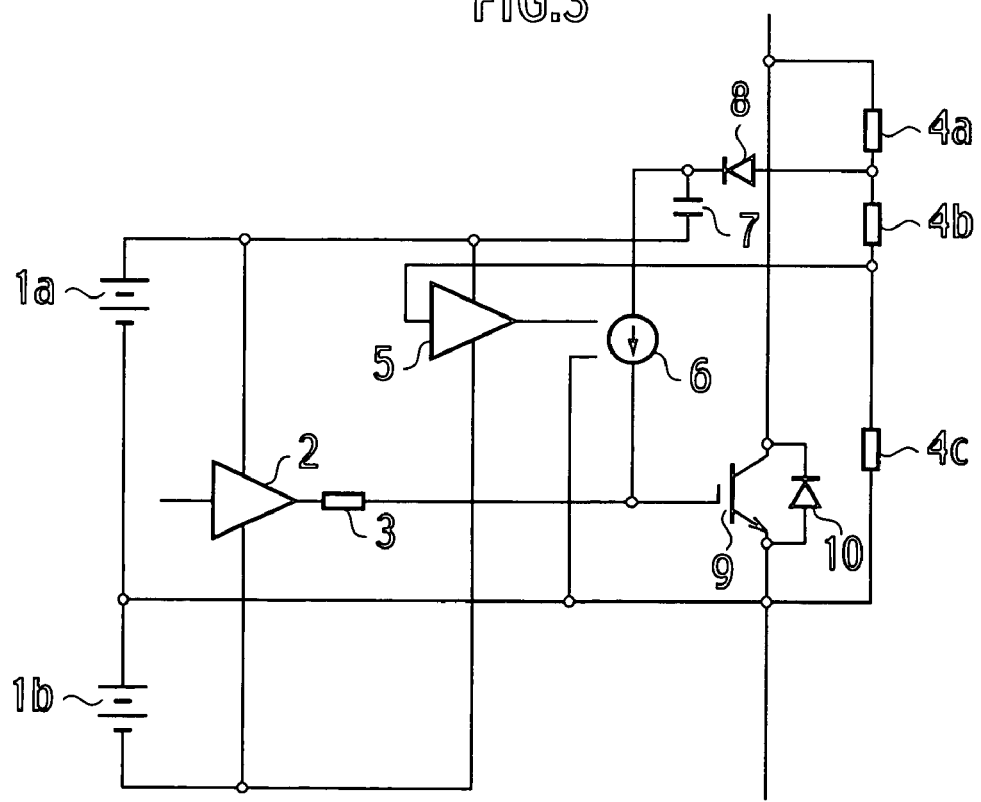
FIG. 3 is a circuit diagram of a second embodiment of the present invention.

FIG. 3 illustrates a second embodiment of the present invention. In the first embodiment, the lower potential terminal of the capacitor 7 is connected to the emitter terminal of the switching element 9. However, since a power source voltage that operates the control current source 6 for an active gate drive has to be higher by a predetermined voltage than the voltage of the gate drive power source 1a under a normal operation condition of the electric power switching element 9, the lower potential terminal of the capacitor 7 in FIG. 2 is connected to the plus terminal of the gate drive power source 1a for the gate driving circuit per se.

As shown in FIG. 3, the capacitor 7 is charged, via the diode 8, with the voltage obtained by dividing the principal voltage Vce using the resistors 4a, 4b in which a voltage dividing ratio is set to be a predetermined ratio, and thus the voltage that is higher, by the charged voltage, than the voltage of the gate drive power source 1a is supplied to the control current source 6 as its power source voltage. In this embodiment, since the voltage applied across the principal electrodes of the electric power switching element 9 and the gate drive power source 1a for the gate driving circuit per se are effectively utilized, the power source for the control current source 6 is composed by not using an additional electric voltage source, thereby reducing a production cost of the gate driving circuit.

A THIRD EMBODIMENT

Figure 4:
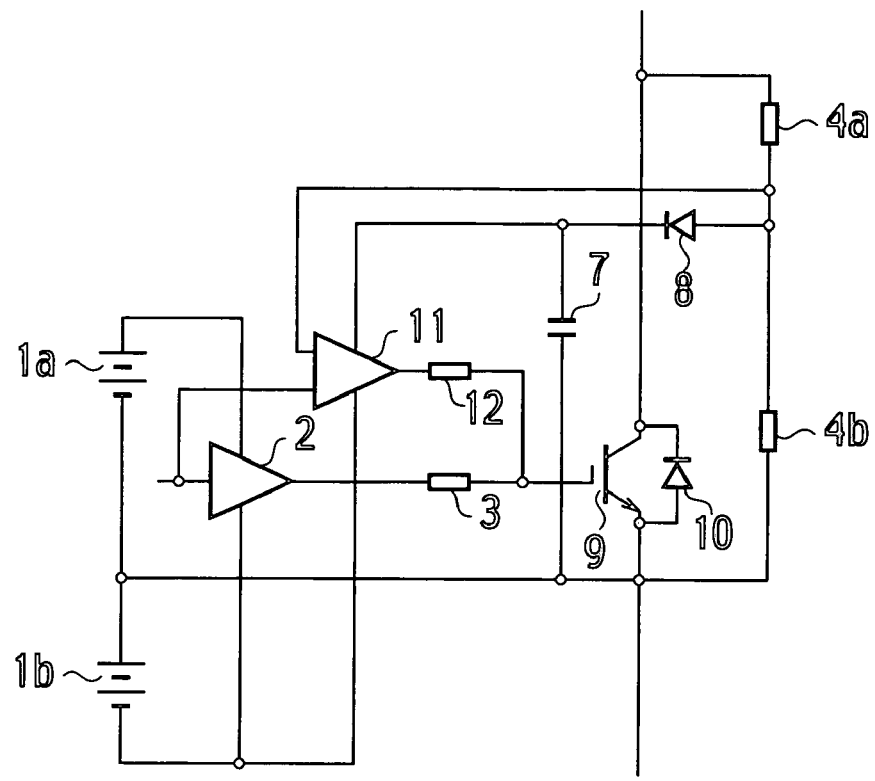
FIG. 4 is a circuit diagram of a third embodiment of the present invention.

FIG. 4 illustrates a third embodiment of the present invention. While in the first and the second embodiment, the control current source 6 is used as an active gate drive means, the active gate drive means operating the gate electrode of the electric power switching element 9 can be realized by a voltage drive means and a resistor.

As shown in FIG. 4, a gate drive circuit according to this embodiment is provided with a voltage amplifier 11 as a voltage drive means. To the voltage amplifier 11 is applied a charged voltage of a capacitor 7 as a power source voltage. The capacitor 7 is charged via the diode 8 with the voltage produced by dividing the principal voltage of the electric power switching element 9 by use of the resistors 4a, 4b.

The output terminal of the voltage amplifier 11 is connected to the gate electrode of the electric power switching element 9 via a resistor 12. The voltage amplifier 11 and the resistor 12 constitute an active gate drive means. Although the voltage amplifier 11 does not operate under the normal operation condition, it does when the voltage Vce between the principal electrodes (collector-emitter) of the electric power switching element 9 exceeds a given voltage value. In other words, the voltage amplifier 11 operates upon detecting an excess in the voltage Vce over a given voltage value.

By the way, as a power source voltage for the voltage amplifier 11, the voltage produced by dividing the principal voltage Vce by use of the resistors 4a, 4b can be directly used. However, it is preferable in terms of ensuring an active gate drive that the voltage smoothed by the diode 8 and the capacitor 7 is applied to the voltage amplifier 11. This is because the principal voltage Vce usually contains a pulse voltage.

A FOURTH EMBODIMENT

Figure 5:
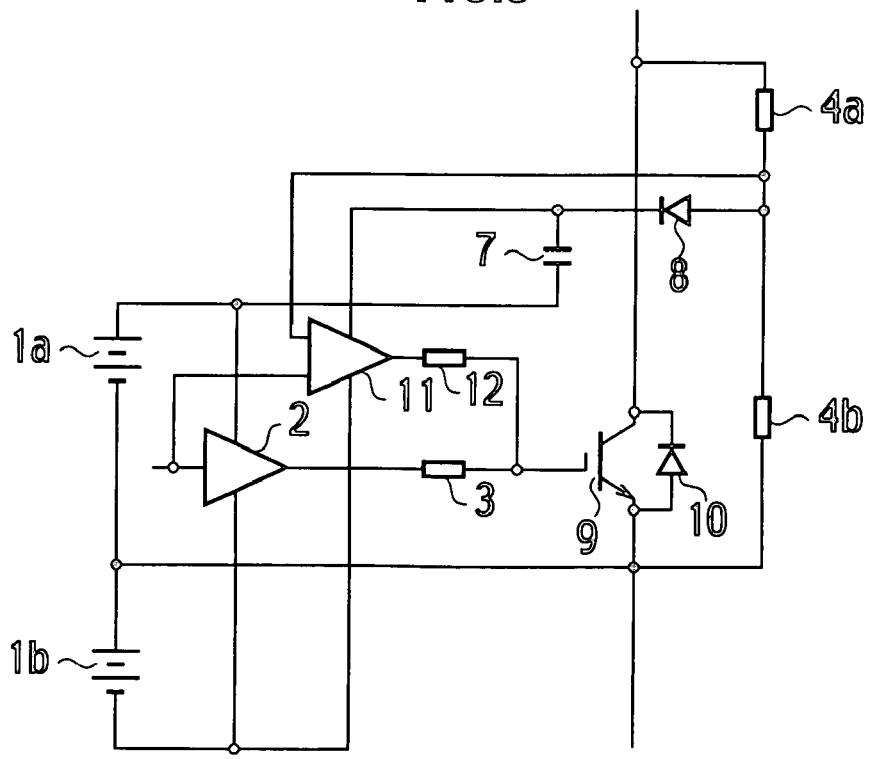
FIG. 5 is a circuit diagram of a fourth embodiment of the present invention.

FIG. 5 illustrates a fourth embodiment of the present invention. In the third embodiment above, the lower potential terminal of the capacitor 7 is connected to the emitter terminal of the electric power switching element 9. However, in the fourth embodiment employing a voltage amplifier 11 as an active gate drive means, the lower potential terminal of the capacitor 7 can be connected to the plus terminal of the gate drive power source 1a for the gate driving circuit per se. Advantages accompanying such a configuration have been described in the second embodiment.

In this embodiment, the voltage applied across the principal electrodes of the electric power switching element 9 and the gate drive power source 1a for the gate driving circuit per se are effectively utilized, thereby configuring the electric power source circuit for the voltage amplifier 11 at lower costs.

A FIFTH EMBODIMENT

Figure 6:
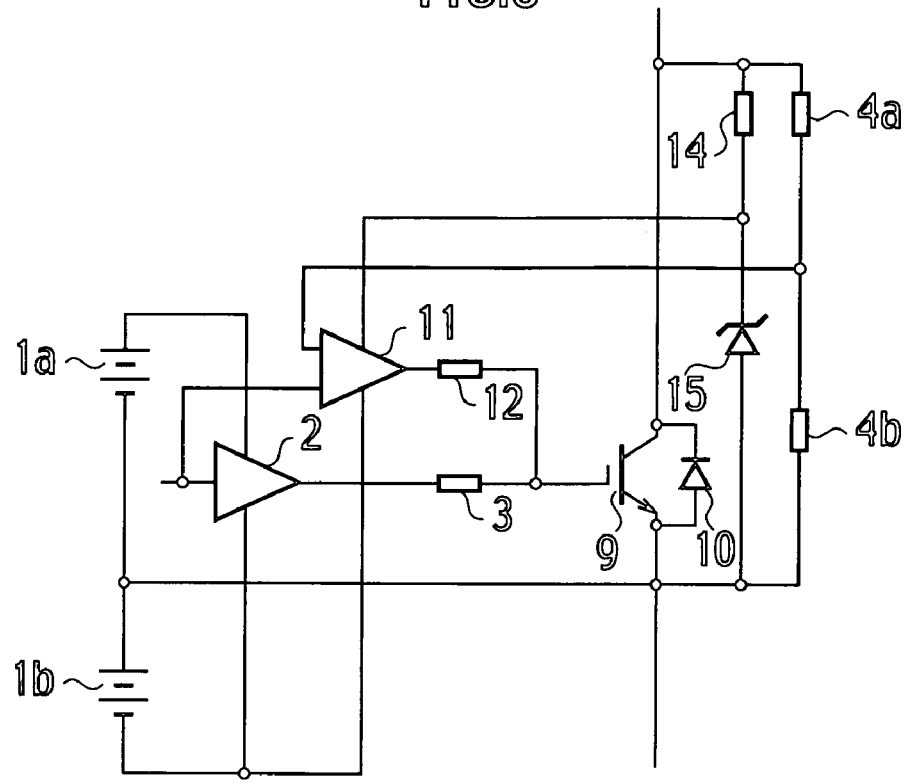
FIG. 6 is a circuit diagram of a fifth embodiment of the present invention.

FIG. 6 illustrates a fifth embodiment of the present invention. In each embodiment above, to the control current source 6 or the voltage amplifier 11 is supplied as a power source voltage a voltage based on the voltage produced by dividing the principal voltage Vce of the electric power switching element 9 by use of the resistors 4a, 4b. In contrast, in the fifth embodiment, a voltage based on the voltage produced by a constant voltage diode is used.

In FIG. 6, a resistor 14 and a constant voltage diode 15 having a predetermined constant voltage characteristic are connected parallel between the principal electrodes of the electric power switching element 9. The voltage across the constant voltage diode 15 is applied to the voltage amplifier 11 as a power source voltage. The voltage amplifier 11 operates when the principal voltage Vce of the electric power switching element 9 exceeds a given voltage.

The voltage across the constant voltage diode 15 can be arbitrarily set to be a most suitable voltage for the voltage amplifier 11 by selecting a constant voltage diode having a predetermined constant voltage characteristic. In addition, since the principal voltage Vce of the electric power switching element 9 usually contains a pulse voltage, as mentioned above, it is preferable to obtain a smoothed charged voltage by connecting a capacitor (not shown) parallel with the constant voltage diode 15 in terms of further ensuring an active gate drive. Moreover, while this embodiment exemplifies a use of the voltage amplifier 11 as an active gate drive means, the aforementioned control current-source can be utilized instead.

A SIXTH EMBODIMENT

Figure 7:
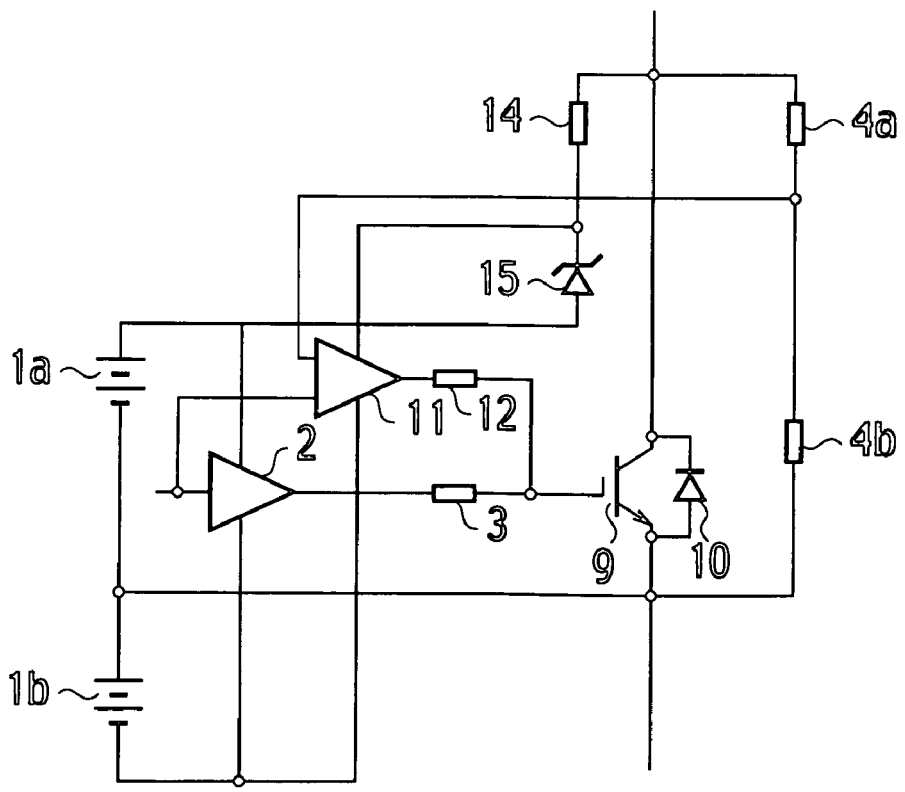
FIG. 7 is a circuit diagram of a sixth embodiment of the present invention.

FIG. 7 illustrates a sixth embodiment of the present invention. In the above fifth embodiment, the minus terminal of the constant voltage diode 15 is connected to the emitter terminal of the electric power switching element 9. However, even in such a configuration in which a voltage across the constant voltage diode 15 is utilized as a power source voltage for the voltage amplifier 11, the minus terminal of the constant voltage diode 15 can be connected to the plus terminal of the gate drive power source 1a for the gate driving source per se by the same reason explained in the second embodiment.

A SEVENTH EMBODIMENT

Figure 8:
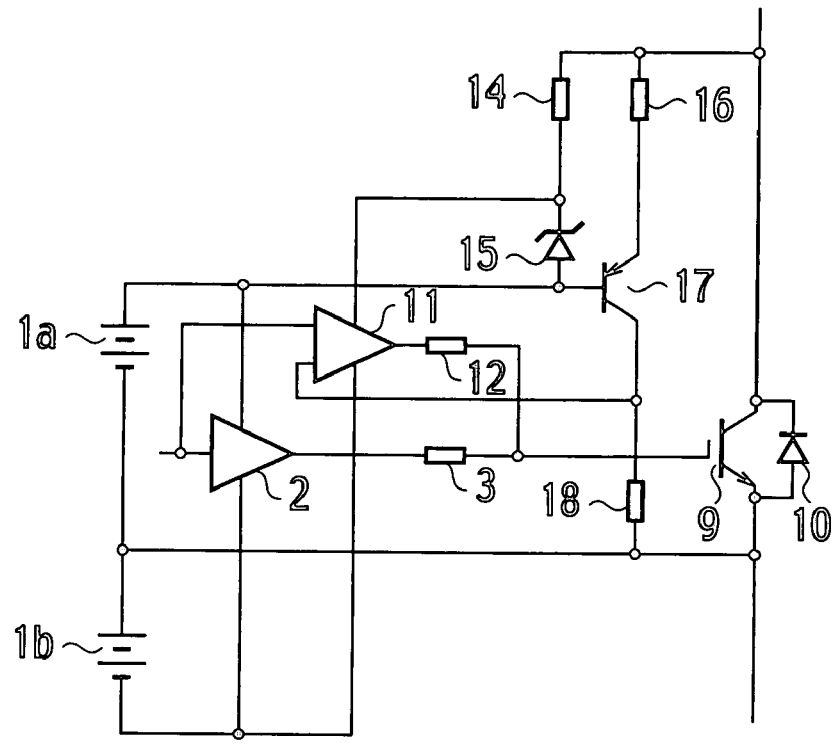
FIG. 8 is a circuit diagram of a seventh embodiment of the present invention.

FIG. 8 illustrates a seventh embodiment of the present invention. In each embodiment described above, a control signal for controlling the voltage amplifier 5 (FIGS. 2 and 3) or the voltage amplifier 11 (FIGS. 4 to 7), that is, a principal voltage detection signal being proportional to the voltage Vce applied across the principal electrodes of the electric power switching element 9 is a voltage signal obtained by dividing the voltage Vce applied across the principal electrodes of the electric power switching element 9 by use of the resistors 4a, 4b. However, the principal voltage detection signal is not necessarily limited to the resistor-divided voltage signal but possibly a current signal obtained by at least one resistor connected in series with the principal electrodes of the electric power switching element 9 and a current detection means configured to detect a current flowing through the resistor.

In the seventh embodiment, the above current detection means is a bipolar transistor 17 with a resistor 16 connected in series, in the principal electrode circuit (collector-emitter circuit). A signal obtained by detecting a current flowing through the principal electrode circuit of the bipolar transistor 17 is utilized as the principal voltage detection signal.

Specifically explaining, the resistor 16 is connected between the collector of the electric power switching element 9 and the emitter of the bipolar transistor 17 and a resistor 18 is connected between the emitter of the electric power switching element 9 and the collector of the bipolar transistor 17 in FIG. 8. Since a collector current and an emitter current of the bipolar transistor 17 are substantially equal to each other, a current flowing through the resistor 16 and a current flowing through the resistor 18 are substantially equal to each other. Therefore, a voltage appearing across the resistor 18 is proportional to the current flowing through the resistor 16.

On the other hand, a voltage applied across the resistor 16 is substantially equal to the principal voltage Vce of the electric power switching element 9, since a voltage of the gate power source 1a and an emitter-base voltage of the bipolar transistor 17 are significantly smaller than the principal voltage Vce applied across the principal electrodes of the electric power switching element 9. Namely, the voltage appearing across the resistor 18 is proportional to the voltage Vce applied across the principal electrodes of the electric power switching element 9.

Therefore, the principal voltage detection signal can be obtained as a voltage signal by detecting via the resistor the current flowing the principal electrode circuit of the bipolar transistor 17, or as a current amplified signal by amplifying the current with the current amplifier. When the principal voltage detection signal is obtained as the current amplified signal, the current flowing through the principal electrode circuit of the bipolar transistor 17 is arbitrarily set, irrespective of an input impedance of the current amplifier. Therefore, the principal voltage detection signal detection circuit with low power consumption can be realized by adjusting the resistance value of the resistor connected in series in the principal electrode circuit of the bipolar transistor 17.

By the way, when a phase compensation capacitor (not shown) is connected parallel with the resistors 16, 18 in the principal voltage detection signal detection circuit in which the resistor 16, the bipolar transistor 17, and the resistor 18 are connected in series, a frequency characteristic of the principal voltage detection signal detection circuit is prevented from deteriorating, thereby detecting the principal voltage detection signal with a high degree of accuracy.

An Eighth Embodiment

Figure 9:
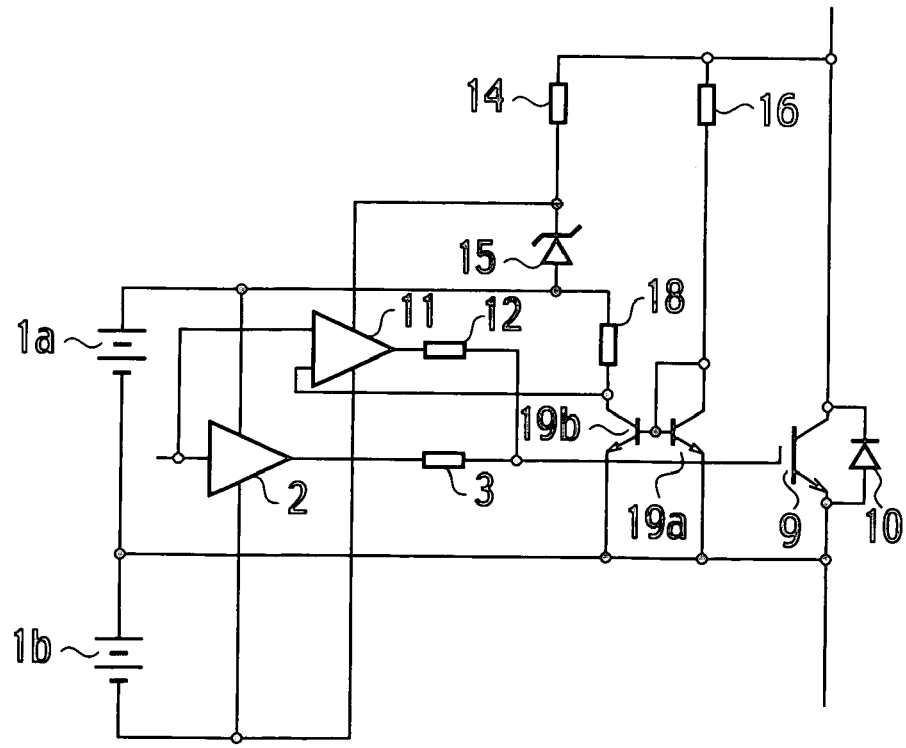
FIG. 9 is a circuit diagram of an eighth embodiment of the present invention.

FIG. 9 illustrates an eighth embodiment of the present invention. This embodiment describes a current detection means configured as a current mirror circuit by using two transistors 19a, 19b. In FIG. 9, a current flowing through a resistor 16 flows into an input transistor circuit (transistor 19a circuit) in the current mirror circuit, and a current flowing into an output transistor circuit (transistor 19b circuit) flows into a resistor 18. Therefore, the principal voltage detection signal can be obtained as a voltage signal by detecting via the resistor 18 the current flowing through the output transistor, or as a current amplified signal obtained by amplifying the current with the current amplifier, as mentioned above.

In case of the current mirror circuit, since substantially the same voltage is applied between the base and the emitter of the two transistors 19a, 19b, in addition to a use of a pair of the transistors 19a, 19b having substantially the same characteristic, the collector currents of the two transistors 19a, 19b are substantially equal. Therefore, the current flowing through the resistor 16 and the current flowing through the resistor 18 are substantially equal to each other, thereby obtaining the principal voltage detection signal by the resistor 18, as mentioned above. By the way, the current mirror circuit is preferable especially for high integration and thus this embodiment is preferable to integrate the control circuit.

INDUSTRIAL APPLICABILITY

The present invention, which relates to a gate driving circuit that drives an electric power switching element, provides at a low cost a power source for an active gate drive means having a simplified construction. Therefore, the present invention is capable of realizing a cost reduction of an electric power converter employing such an electric power switching element.

The invention claimed is:

1. A gate driving circuit comprising:
    an electric power switching element having a gate electrode that receives a gate driving signal;
    two resistors that divide a principal voltage applied between principal electrodes of the electric power switching element;
    a diode and a control current source connected in series between a circuit point between the two resistors and the gate electrode of the electric power switching element;
    a capacitor connected between a circuit point between the diode and the control current source and an emitter electrode of the electric power switching element; and
    a voltage amplifier that receives a divided voltage signal generated on the circuit point between the two resistors and outputs a control signal for controlling the control current source,
    wherein the capacitor is charged via the diode according to the divided voltage signal, and
    an output terminal of the control current source is connected directly to the gate electrode of the electric power switching element.

* * * * *